United States Patent
Zhou et al.

(10) Patent No.: US 12,360,137 B1
(45) Date of Patent: Jul. 15, 2025

(54) INTELLIGENT ELECTRIC METER DIGITAL MANUFACTURING PLATFORM BASED ON INTELLIGENT MANUFACTURING

(71) Applicant: Changshu Institute Of Technology, Changshu (CN)

(72) Inventors: Jian Zhou, Changshu (CN); Shan Zhong, Changshu (CN); LiFan Zhou, Changshu (CN)

(73) Assignee: Changshu Institute Of Technology, Changshu (CN)

( * ) Notice: Subject to any disclaimer, the term of this patent is extended or adjusted under 35 U.S.C. 154(b) by 0 days.

(21) Appl. No.: 19/002,822

(22) Filed: Dec. 27, 2024

(30) Foreign Application Priority Data

May 7, 2024 (CN) .......................... 202410555057.1

(51) Int. Cl.
*G01R 3/00* (2006.01)
*B25H 1/10* (2006.01)
*G01R 21/133* (2006.01)

(52) U.S. Cl.
CPC ................. *G01R 3/00* (2013.01); *B25H 1/10* (2013.01); *G01R 21/1333* (2013.01)

(58) Field of Classification Search
CPC ...... B23Q 1/01–017; B23Q 1/25; B23Q 1/42; B23Q 1/52; B23Q 1/56–585; B23Q 1/601; B23Q 7/001; B23Q 7/1447–1457; B23Q 7/1468; B25H 1/10; B25J 15/0028; B25J 5/02; B25J 9/0093; B25J 9/0096; G01R 1/06705; G01R 1/07342; G01R 1/07392; G01R 21/133–1338; G01R 3/00; G01R 35/04

(Continued)

(56) References Cited

U.S. PATENT DOCUMENTS

| | | | | |
|---|---|---|---|---|
| 3,273,408 A | * | 9/1966 | Nagel | F16H 35/00 400/322 |
| 5,107,206 A | * | 4/1992 | Yanagi | G01R 31/2806 324/763.01 |
| 5,125,281 A | * | 6/1992 | Mottate | F16H 19/06 74/89.21 |

FOREIGN PATENT DOCUMENTS

DE       10102413 C1 * 1/2002 ............. B23Q 1/012

OTHER PUBLICATIONS

CNIPA, Notification of First Office Action for CN202410555057.1, Sep. 20, 2024.

(Continued)

*Primary Examiner* — Tyrone V Hall, Jr.
(74) *Attorney, Agent, or Firm* — Hemisphere Law, PLLC; Zhigang Ma (57) ABSTRACT

An intelligent electric meter digital manufacturing platform based on intelligent manufacturing includes: an electric push rod fixedly disposed in a frame and a testing machine disposed on the electric push rod. The testing machine includes a box fixedly disposed on a telescopic shaft of the electric push rod and a testing component disposed in the box. A first pulley drives two ends of a pulling rope to move from a middle end of a side wall of the pulling rope through driving of a servo motor. This makes an end of the pulling rope pull a testing probe to move upwards, the other end of the pulling rope pull the other testing probe to move downwards, allowing it move to a bottom of the box. This design avoids affecting testing efficiency due to the need to replace or maintain the testing probes, facilitating subsequent testing of an intelligent electric meter.

8 Claims, 7 Drawing Sheets

(58) Field of Classification Search
USPC .......................................................... 324/74
See application file for complete search history.

(56) References Cited

OTHER PUBLICATIONS

Changshu Institute of Technology (Applicant), Replacement claims (allowed) of CN202410555057.1, Oct. 18, 2024.
CNIPA, Notification to grant patent right for invention in CN202410555057.1, Oct. 25, 2024.

* cited by examiner

INTELLIGENT ELECTRIC METER DIGITAL MANUFACTURING PLATFORM BASED ON INTELLIGENT MANUFACTURING

CROSS-REFERENCE TO RELATED APPLICATION

This application claims priority to Chinese Patent Application No. 202410555057.1, filed May 7, 2024, which is herein incorporated by reference in its entirety.

TECHNICAL FIELD

The disclosure relates to the field of electric meter testing technologies, and more particularly to a smart electric meter digital manufacturing platform based on smart manufacturing.

BACKGROUND

Smart Intelligent electric meter is one of the basic equipment of data collection in smart grids, which undertakes tasks of collection, measurement and transmission of original electric energy data, and is a basis to achieve information integration, analysis optimization and information presentation. In order to ensure the quality of a product, the smart electric meter needs to be tested after assembly to check whether its performance is qualified.

A Chinese patent with a publication number CN117452317B discloses a smart electric meter testing equipment, and a problem raised in its background is that during testing of the smart electric meter, a testing probe of the testing equipment is prone to absorb dust during long-term use. The dust will affect a contact between the testing probe and the smart electric meter, thereby affecting stability. In addition, in an assembly line detection, it is generally necessary to transfer the smart electric meter from a conveyor belt to the corresponding testing equipment for detection, which increases downtime on the production line and requires additional manpower and equipment for transfer, thus increasing costs and reducing production efficiency. Therefore, there are several shortcomings in the related art as follows.

The testing equipment generates gas to be discharged into an air jet ring through components, and the gas is sprayed to the testing probe through a flat opening of the air jet ring to clean the surface of the testing probe and prevent the dust on the surface of the test probe from affecting the test accuracy. At the same time, there is no need for other transfer machinery or manual transfer of the smart electric meter, improving the efficiency of testing. However, in an actual testing process, the testing probe not only has dust and other impurities adhering to its surface but also may suffer from damage and other conditions. When cleaning or repairing the testing probe, the testing will be paused and a testing result will be affected. Alternatively, when the testing probe is damaged, the testing will be conducted through the other testing probe, and a conveying mechanism is required to move the smart electric meter to a position of the other testing probe, which is complex to operate and has certain shortcomings. In order to solve aforementioned problems, a smart electric meter digital manufacturing platform based on smart manufacturing is proposed.

SUMMARY

In order to overcome the shortcomings in the related art mentioned above, the disclosure provides a smart electric meter digital manufacturing platform based on smart manufacturing. When a testing probe has dust on its surface or is damaged, it is convenient to test a smart electric meter at a same position with the other testing probe without a need to pause the testing, which improves work efficiency. Additionally, there is no need for a conveying mechanism to move the smart electric meter to a position of the other testing probe, thereby making it convenient to use for testing.

In order to achieve the aforementioned purpose, the smart electric meter digital manufacturing platform base on the smart manufacturing provided by the disclosure includes: a workbench, a conveyor disposed on a top of the workbench, a frame fixedly disposed on a back of the workbench, an electric push rod fixedly disposed on an inner side of the frame, and a testing machine disposed on a telescopic shaft of the electric push rod;

the testing machine includes: a box fixedly disposed on the telescopic shaft of the electric push rod, a testing component disposed in the box, and testing probes disposed on a bottom of the testing component;

the testing component includes an installation base fixedly disposed on an inner wall of a bottom of the box; first sliding grooves are defined on a front of the installation base and mirror-symmetrically arranged with a center point of the installation base, the first sliding grooves are designed to be inclined, and a first connecting piece and a second connecting piece are respectively slidably connected to insides of the first sliding grooves; bottoms of the first connecting piece and the second connecting piece are respectively fixedly connected to tops of the testing probes, auxiliary components are respectively disposed between the first sliding grooves and the first connecting piece and the second connecting piece, and the auxiliary components are configured to connect the first sliding grooves and the first connecting piece and the second connecting piece; and each auxiliary component includes a first slider disposed in a corresponding one of the first sliding grooves and configured to slid along the corresponding one of the first grooves; a front of the first slider is slidably connected to a connecting plate, and a front of the connecting plate is fixedly connected to a back of a corresponding one of the first connecting piece and the second connecting piece.

In an embodiment, the testing component further includes:

a servo motor fixedly disposed on a back of the installation base; a rotating shaft is disposed on the servo motor and extended to the front of the installation base through a coupling, and a first pulley is disposed on an end of the rotating shaft located on the front of the installation base; and a second pulley rotatably disposed on a lower end of the front of the installation base, and a pulling rope fixedly disposed on a top of the first connecting piece; an end of the pulling rope facing away from the first connecting piece is fixedly connected to the bottom of the second connecting piece, the pulling rope is passed around the first pulley and the second pulley, a side wall of the pulling rope is fixedly connected to an inner side of the first pulley, the second pulley is configured to change a pulling direction of the pulling rope to the second connecting piece, so as to make the pulling rope pull one of the testing probes to move upwards through the first connecting piece and pull the other of the testing probes to move downwards through the second connecting piece when the servo motor drives the first pulley to rotate.

In an embodiment, the testing machine further includes box doors hinged to a front and a back of the box respectively; the box door disposed on the back of the box is defined with an installation hole configured to sleeve the servo motor, and a bottom of the box is defined with a through-hole configured to move the testing probes.

In an embodiment, each auxiliary component further includes a second sliding groove defined on the front of the first slider and is extended to a bottom of the first slider; a second slider is fixedly disposed on a top of the connecting plate, the second slider is matched to the second sliding groove, and a top of the second slider defines a limit groove.

In an embodiment, each auxiliary component further includes a U-shaped frame fixedly disposed on a top of the first slider; a limit rod is sleeved to a top of the U-shaped frame and is extended to an inner side of the U-shaped frame, and a lower end of the limit rod is matched to an inner wall of the limit groove; the limit groove is located directly below the limit rod when the second slider slides into the second sliding groove and is tightly pressed against the second sliding groove to stop sliding.

In an embodiment, each auxiliary component further includes a baffle plate fixedly sleeved to a side wall of the limit rod located in the U-shaped frame; a spring is sleeved between the side wall of the limit rod and a top of the baffle plate, and the spring is configured to elastically support the baffle plate and the limit rod.

In an embodiment, a lower end of the first slider is designed to be a concave shape to make the second slider be driven the connecting plate to move to the bottom of the first slider along the second sliding groove.

In an embodiment, inclination degrees of the first connecting piece, the second connecting piece and the testing probes are consistent with inclination degrees of the first sliding grooves.

The disclosure provides the smart electric meter digital manufacturing platform based on the smart manufacturing. Compared to the related art, it has the following beneficial effects.

1. The servo motor of the testing component drives the first pulley to rotate, and then the first pulley drives two ends of the pulling rope to move from a middle end of the side wall of the pulling rope in the process of the rotation. This makes an end of the pulling rope pull the first connecting piece to move upwards along the corresponding one of the first sliding grooves, thereby driving one of the testing probes to move upwards. The other end of the pulling rope pulls the second connecting piece to move downwards through the second pulley, thereby driving the other of the testing probes to move downwards. This allows the other of the testing probes to pass through the through-hole and move to the bottom of the box. This design avoids affecting testing efficiency due to the need to replace or maintain the testing probes, facilitating subsequent testing of the smart electric meter.

2. The first sliding grooves are designed to be inclined, and the inclination degrees of the first connecting piece, the second connecting piece and the testing probes are consistent with the inclination degrees of the first sliding grooves, which makes the testing probes have an intersection point after moving a certain distance. This makes the testing probes measure the smart electric meter at a same position without adjusting a stay position of the smart electric meter, thereby facilitating practical testing use.

3. The first connecting piece, the second connecting piece and the testing probes are easy to be disconnected and installed through the auxiliary components, which makes it convenient to replace and maintain the testing probes. Furthermore, by using the second slider and the second sliding groove to pre-position the connecting plate, the first connecting piece, and the second connecting piece, and then using the limit rod and the limit groove for re-positioning to ensure the stability of the installation of the first connecting piece and the second connecting piece, thereby ensuring the stability of the installation of the testing probes.

Description of reference signs involved in the aforementioned accompanying drawings: 1, workbench; 2, conveyor; 3, frame; 4, electric push rod; 5, testing machine; 6, telescopic shaft; 7, pulling rope;

51, box; 52, box door; 53, auxiliary component; 54, testing component; 55, testing probe; 56, through-hole; 57, installation hole;

531, first slider; 532, limit rod; 533, U-shaped frame; 534, second sliding groove; 535, limit groove; 536, connecting plate; 537, baffle plate; 538, second slider; 539, spring; and

541, servo motor; 542, first sliding groove; 543, installation base; 544, first connecting piece; 545, second connecting piece; 546, first pulley; 547, second pulley; 548, coupling; 549, rotating shaft.

DETAILED DESCRIPTION OF EMBODIMENTS

The following will provide a clear and complete description of the technical solution in embodiments of the disclosure, in conjunction with the accompanying drawings. Apparently, the described embodiments are only a part of the embodiments of the disclosure, not all of them. Based on the embodiments in the disclosure, all other embodiments obtained by those skilled in the art without creative labor fall within the scope of protection of the disclosure.

Embodiment 1

Referring to FIGS. 1-6, a smart electric meter digital manufacturing platform based on smart manufacturing includes: a workbench 1, a conveyor 2, a frame 3, an electric push rod 4, and a testing machine 5. The conveyor 2 is disposed on a top of the workbench 1 and configured to transport a smart electric meter. The frame 3 is fixedly disposed on a back of the workbench 1. The electric push rod 4 is fixedly disposed on an inner side of the frame 3. The testing machine 5 is disposed on an output shaft of the electric push rod 4.

The testing machine 5 includes a box 51, and the box 51 is fixedly disposed on a telescopic shaft of the electric push rod 4. A testing component 54 is disposed in the box 51. Testing probes 55 are disposed on a bottom of the testing component 54 and configured to test the smart electric meter.

The testing machine 5 further includes box doors 52 hinged to a front and a back of the box 51 respectively; the box door 52 disposed on the back of the box 51 is defined with an installation hole 56 configured to sleeve a servo motor 541, and a bottom of the box 51 is defined with a through-hole configured to move the testing probes 55.

During specific implementation, the smart electric meter to be tested is conveyed by the conveyor 2. The smart electric meter is stopped under the testing probes 55, and then the telescopic shaft of the electric push rod 4 drives the box 51 to move, thereby moving the testing probes 55 to test the smart electric meter.

Figure 1:
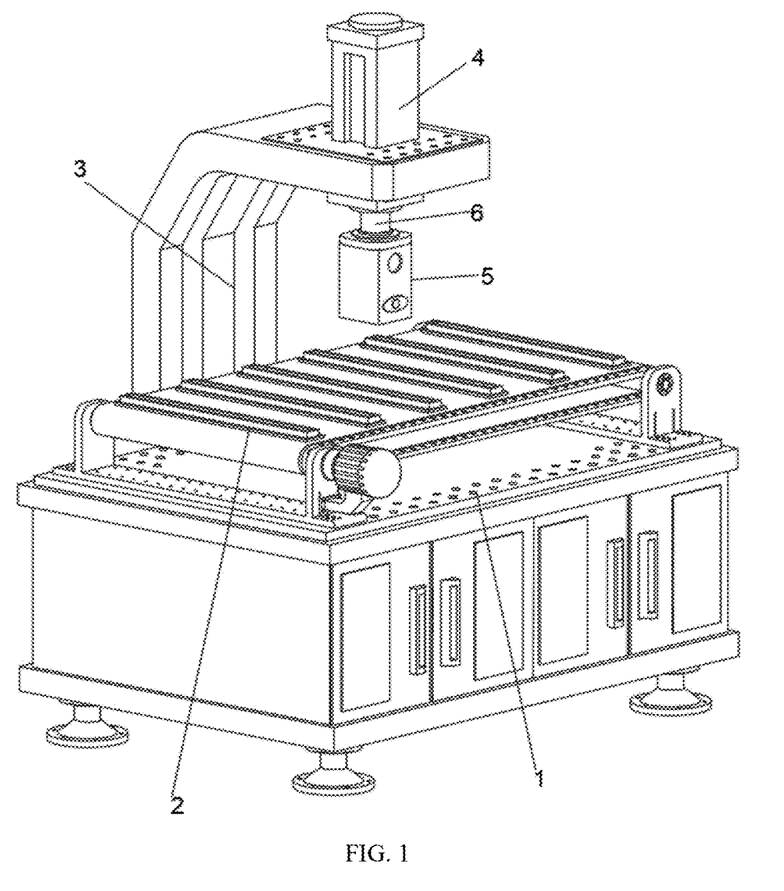
FIG. 1 illustrates a schematic front view of an overall structure of a smart electric meter digital manufacturing platform based on smart manufacturing provided by the disclosure.
Figure 2:
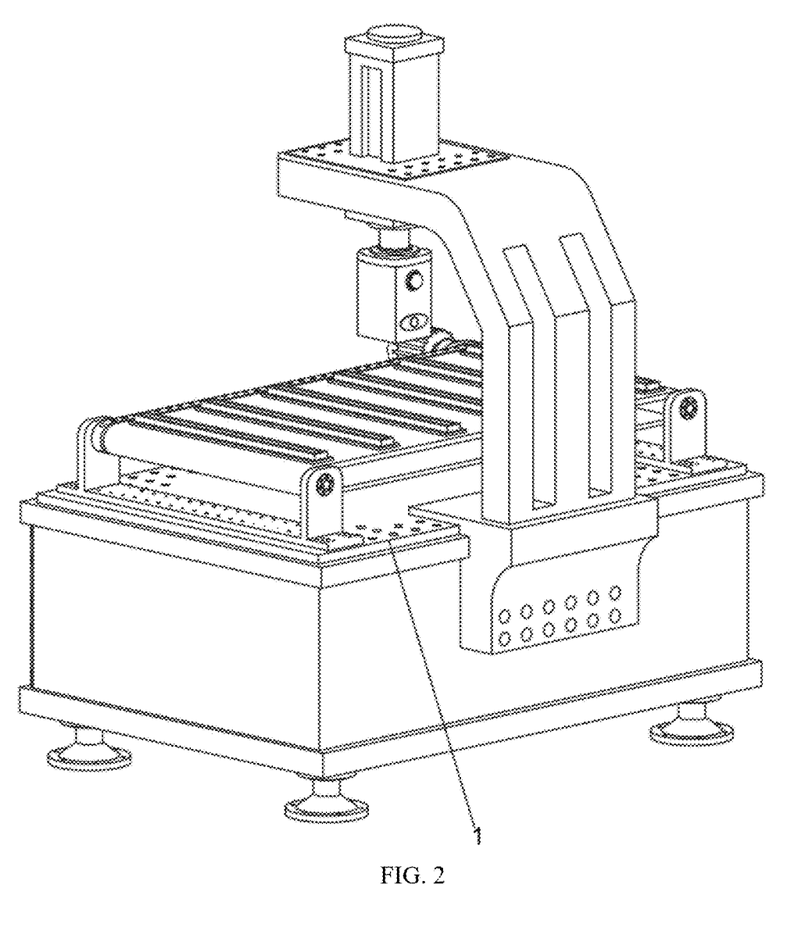
FIG. 2 illustrates a schematic rear view of the overall structure of the smart electric meter digital manufacturing platform based on the smart manufacturing provided by the disclosure.
Figure 3:
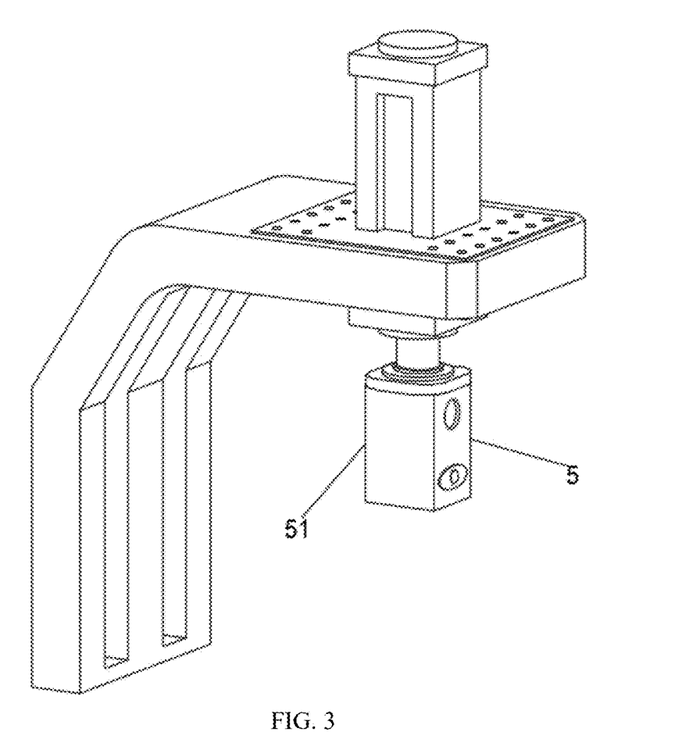
FIG. 3 illustrates a schematic structural diagram of a testing machine and a box provided by the disclosure.
Figure 4:
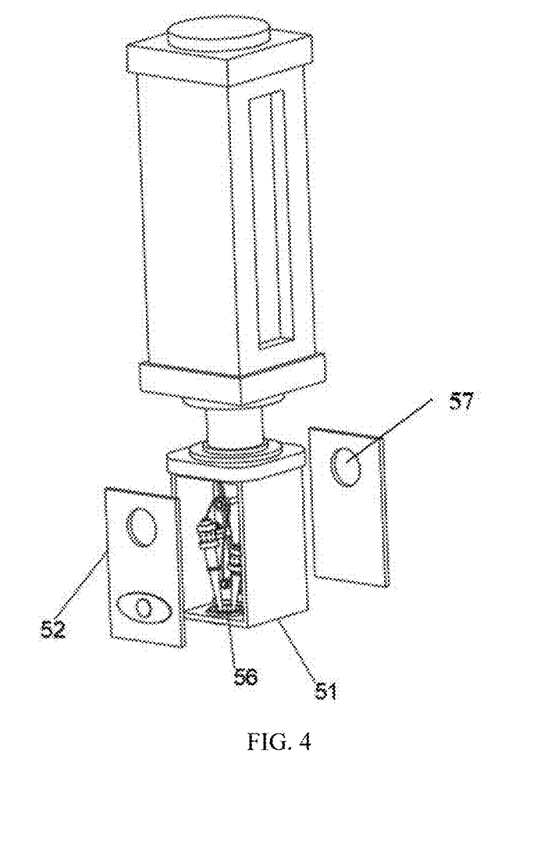
FIG. 4 illustrates a schematic exploded view of the box and a box door provided by the disclosure.
Figure 5:
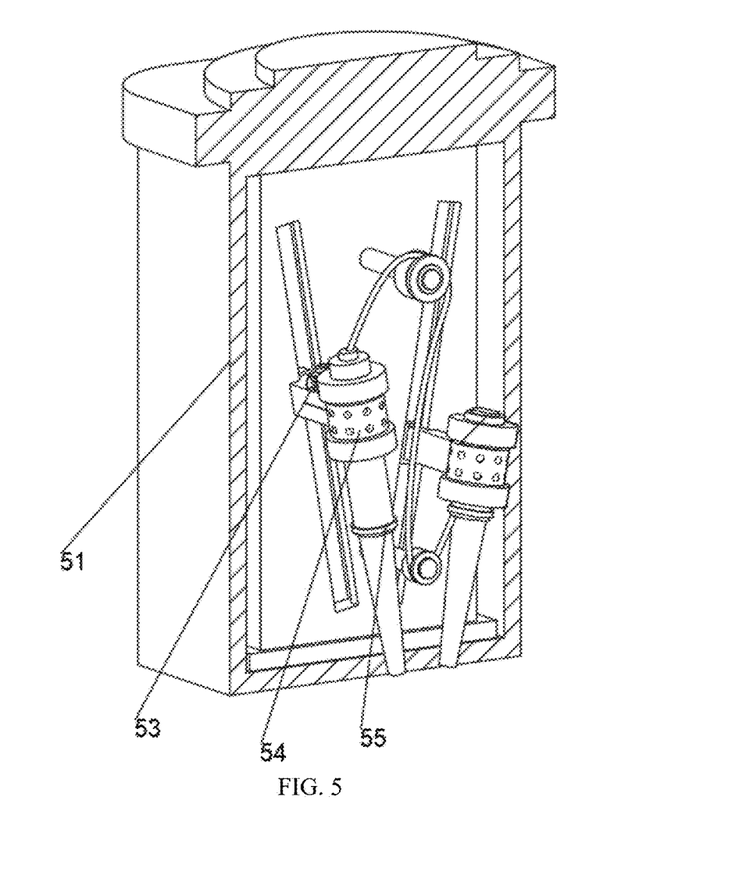
FIG. 5 illustrates a schematic cross-sectional view of the box provided by the disclosure.
Figure 6:
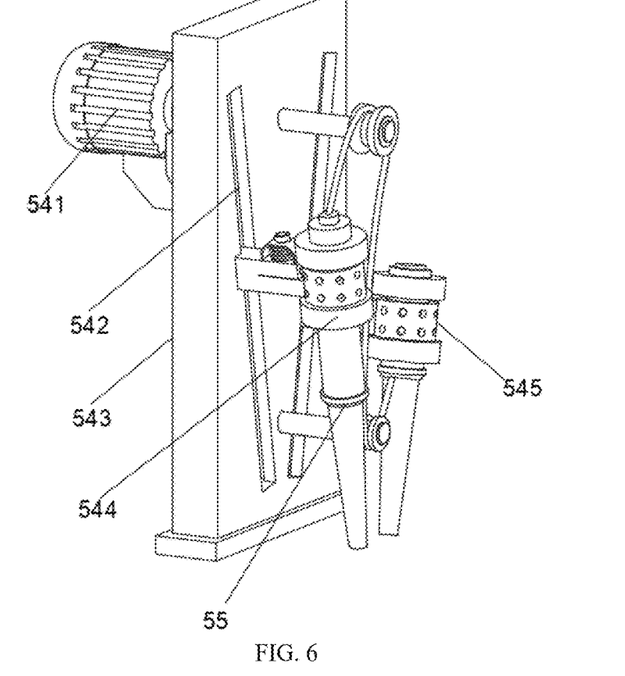
FIG. 6 illustrates a schematic structural diagram of a testing component provided by the disclosure.
Figure 7:
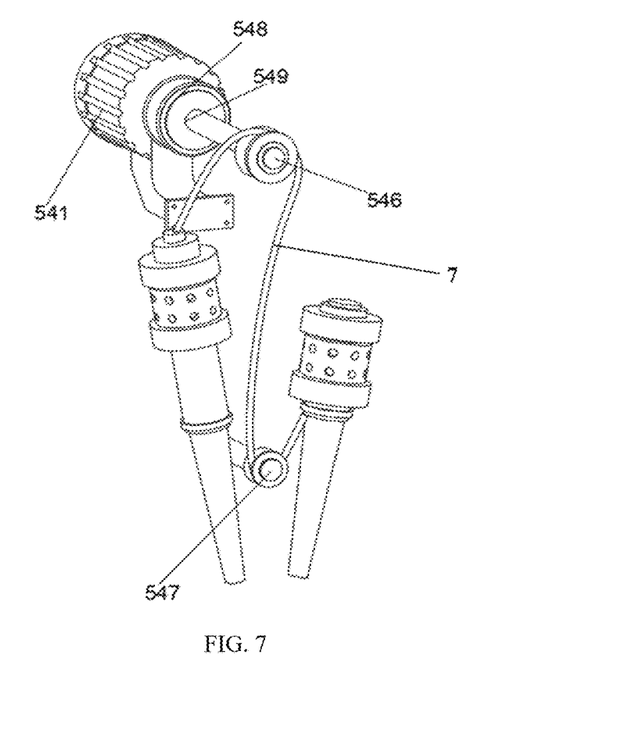
FIG. 7 illustrates a schematic structural diagram of a first pulley, a second pulley and a servo motor provided by the disclosure.

Referring to FIGS. 5-7, the testing component 54 includes: an installation base 543, which is fixedly disposed on an inner wall of a bottom of the box 51. First sliding grooves 542 are defined on a front of the installation base 543 and mirror-symmetrically arranged with a center point of the installation base 543, and the first sliding grooves 542 are designed to be inclined. A first connecting piece 544 and a second connecting piece 545 are respectively slidably connected to insides of the first sliding grooves 542, and bottoms of the first connecting piece 544 and the second connecting piece 545 are respectively fixedly connected to tops of the testing probes 55. Auxiliary components 53 are respectively disposed between the first sliding grooves 542 and the first connecting piece 544 and the second connecting piece 545, and the auxiliary components 53 are configured to connect the first sliding grooves 542 and the first connecting piece 544 and the second connecting piece 545.

The testing component 54 further includes: the servo motor 541, which is fixedly disposed on a back of the installation base 543. A rotating shaft 549 is disposed on an output shaft of the servo motor 541 and extended to the front of the installation base 543 through a coupling 548. A first pulley 546 is disposed on an end of the rotating shaft 549 located on the front of the installation base 543.

A second pulley 547 is rotatably disposed on a lower end of the front of the installation base 543. A pulling rope 57 is fixedly disposed on a top of the first connecting piece 544. An end of the pulling rope 57 facing away from the first connecting piece 544 is fixedly connected to the bottom of the second connecting piece 545, and the pulling rope 57 is passed around the first pulley 546 and the second pulley 547. A side wall of the pulling rope 57 is fixedly connected to an inner side of the first pulley 546, the second pulley 547 is configured to change a pulling direction of the pulling rope 57 to the second connecting piece 545, so that when the servo motor 541 drives the first pulley 546 to rotate, the pulling rope 57 pulls one of the testing probes 55 to move upwards through the first connecting piece 544 and pulls the other of the testing probes 55 to move downwards through the second connecting piece 545.

Inclination degrees of the first connecting piece 544, the second connecting piece 545 and the testing probes 55 are consistent with inclination degrees of the first sliding grooves 542.

During specific implementation, when the servo motor 541 is started, the output shaft of the servo motor 541 drives the rotating shaft 549 to rotate through the coupling 548, and then the rotating shaft 549 drives the first pulley 546 to rotate. Since the side wall of the pulling rope 57 is fixedly connected to the inner side of the first pulley 546 and the second pulley 547 is arranged, a rotation of the first pulley 546 drives two ends of the pulling rope 57 to move from a middle end of the side wall of the pulling rope 57. One end of the pulling rope 57 drives the first connecting piece 544 to move upwards along a corresponding one of the first sliding grooves 542, thereby moving the one of the testing probes 55 upwards. The other end of the pulling rope 57 drives the second connecting piece 545 to move downwards through the second pulley 547, thereby moving the other of the testing probes 55 downwards, allowing the other of the testing probes 55 to pass through the through-hole and move to the bottom of the box 51, facilitating subsequent testing of the smart electric meter.

Due to an inclined design of the first sliding grooves 542, and the inclination degrees of the first connecting piece 544, the second connecting piece 545 and the testing probes 55 are consistent with the inclination degrees of the first sliding grooves 542, which makes the testing probes 55 have an intersection point after moving a certain distance. This makes the testing probes 55 to measure the smart electric meter at a same position without adjusting a stay position of the smart electric meter, thereby facilitating practical testing use.

Embodiment 2

Figure 8:
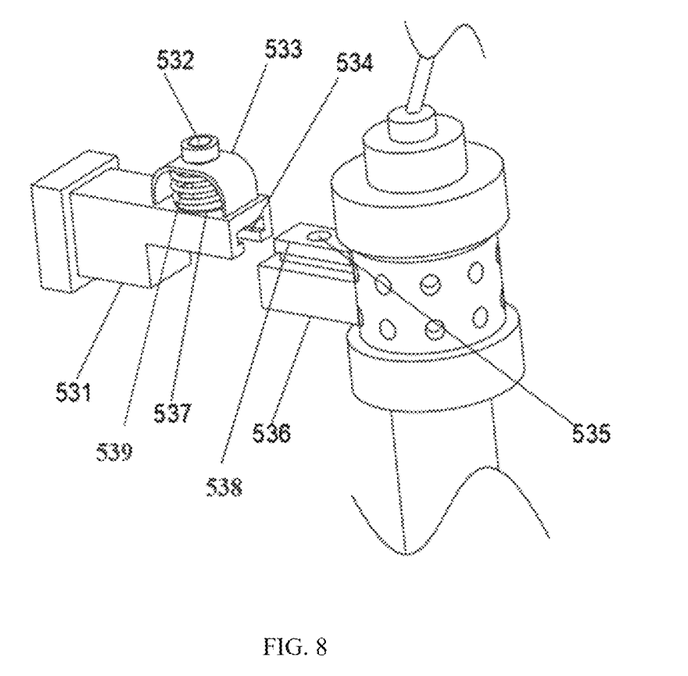
FIG. 8 illustrates a schematic structural diagram of an auxiliary component provided by the disclosure.

Referring to FIG. 8, the difference in technical scheme compared to the embodiment 1 is as follows. Each auxiliary component 53 includes a first slider 531. The first slider 531 is disposed in a corresponding one of the first sliding grooves 542 and is configured to slide along the corresponding one of the first sliding grooves 542. A connecting plate 536 is slidably connected to a front of the first slider 531, and a front of the connecting plate 536 is fixedly connected to a back of a corresponding one of the first connecting piece 544 and the second connecting piece 545.

Each auxiliary component 53 further includes: a second sliding groove 534, which is defined on the front of the first slider 531 and is extended to a bottom of the first slider 531. A second slider 538 is fixedly disposed on a top of the connecting plate 536, the second slider 538 is matched to the second sliding groove 534, and a top of the second slider 538 defines a limit groove 535.

Each auxiliary component 53 further includes: a U-shape frame 533, which is fixedly disposed on a top of the first slider 531. A limit rod 532 is sleeved to a top of the U-shaped frame 533 and is extended to an inner side of the U-shaped frame 533. A lower end of the limit rod 532 is matched to an inner wall of the limit groove 535. When the second slider 538 slides into the second sliding groove 534 and is tightly pressed against the second sliding groove 534 to stop sliding, the limit groove 535 is located directly below the limit rod 532.

Each auxiliary component 53 includes: a baffle plate 537, and the baffle plate 537 is sleeved to a side wall of the limit rod 532 located in the U-shaped frame 533. A spring 539 is sleeved between the side wall of the limit rod 532 and a top of the baffle plate 537, and the spring 539 is configured to elastically support the baffle plate 537 and the limit rod 532.

A lower end of the first slider 531 is designed to be a concave shape to make the second slider 538 be driven the connecting plate 536 to move to the bottom of the first slider 531 along the second sliding groove 534.

During the specific implementation, the limit rod 532 is pulled to drive the baffle plate 537 to squeeze the spring 539 and move, thereby allowing the lower end of the limit rod 532 to disconnect to the limit groove 535. That is, this makes the second slider 538 to move along the second sliding groove 534 and disconnect to the second sliding groove 534, allowing for a removal of the second connecting piece 545, the first connecting piece 544, and the testing probes 55.

When the testing probes 55 are to be installed, simply perform a reverse operation. By using the second slider 538 and the second sliding groove 534 to pre-position the connecting plate 536, the first connecting piece 544, and the second connecting piece 545, and then using the limit rod 532 and the limit groove 535 for re-positioning to ensure the stability of the installation of the first connecting piece 544 and the second connecting piece 545, thereby ensuring the stability of the installation of the testing probes 55.

When the smart electric meter digital manufacturing platform is in use, it transports the smart electric meter to be tested through the conveyor 2, pauses it beneath the testing probes 55, and then, it drives the box 51 to move through the telescopic shaft of the electric push rod 4, thereby moving the testing probes 55 to test the smart electric intelligent meter.

When one of the testing probes 55 has a significant amount of dust on its surface or is damaged and cannot continue to be used or affects the testing, the testing 10 component 54 is configured to move the one of the testing probes 55 upwards. Simultaneously, the other of the testing probes 55 moves downwards through the first pulley 546, the second pulley 547, and the pulling rope 57. Due to the inclined design of the testing probes 55, the testing probes 55 will have an intersection after moving a certain distance, which allows the bottom of the other of the testing probes 55, that is, a testing end, to be located at the position of the one of the unusable testing probes 55, which makes the smart electric meter can continue to be tested using the other of the testing probes 55 without adjusting the position where the smart electric meter is stopped.

When the testing probes 55 are damaged, the box door 52 on the front of the box 51 is opened, and the first connecting piece 544, the second connecting piece 545, and the testing probes 55 can be easily removed through the auxiliary components 53, facilitating replacement and maintenance, and ensuring convenience for long-term use.

Additionally, the content not described in detail in this specification is considered to be the related art known to those skilled in the art.

It should be noted that in this document, relational terms such as "first" and "second" are merely used to distinguish one entity or operation from another, and do not necessarily require or imply any actual relationship or order between these entities or operations. Moreover, the terms "include", "have" or any other variations thereof are intended to encompass non-exclusive inclusion, so that a process, method, item, or device that includes a set of elements not only includes those elements but also includes other elements that are not explicitly listed, or even includes elements inherent to such a process, method, item, or device.

Although embodiments of the disclosure have been shown and described, it will be understood by those skilled in the art that various changes, modifications, substitutions, and variations can be made to these embodiments without departing from the principles and spirit of the disclosure. The scope of the disclosure is defined by the appended claims and their equivalents.

What is claimed is:

1. A testing apparatus for testing a smart electric meter, the testing apparatus comprising: a workbench, a conveyor disposed on a top of the workbench, a frame fixedly disposed on a back of the workbench, an electric push rod fixedly disposed on an inner side of the frame, and a testing machine disposed on a telescopic shaft of the electric push rod;

wherein the testing machine comprises: a box fixedly disposed on the telescopic shaft of the electric push rod, a testing component disposed in the box, and testing probes disposed on a bottom of the testing component;

wherein the testing component comprises: an installation base fixedly disposed on an inner wall of a bottom of the box; first sliding grooves are defined on a front of the installation base and mirror-symmetrically arranged with a center point of the installation base, the first sliding grooves are designed to be inclined, and a first connecting piece and a second connecting piece are respectively slidably connected to insides of the first sliding grooves; bottoms of the first connecting piece and the second connecting piece are respectively fixedly connected to tops of the testing probes, auxiliary components are respectively disposed between the first sliding grooves and the first connecting piece and the second connecting piece, and the auxiliary components are configured to connect the first sliding grooves and the first connecting piece and the second connecting piece;

wherein each auxiliary component comprises a first slider disposed in a corresponding one of the first sliding grooves and configured to slide along the corresponding one of the first sliding grooves; a front of the first slider is slidably connected to a connecting plate, and a front of the connecting plate is fixedly connected to a back of a corresponding one of the first connecting piece and the second connecting piece; and wherein the testing component further comprises:
a servo motor fixedly disposed on a back of the installation base, a rotating shaft disposed on the servo motor and extended to the front of the installation base through a coupling, and a first pulley fixedly disposed on an end of the rotating shaft located on the front of the installation base; and
a second pulley rotatably disposed on a lower end of the front of the installation base, and a pulling rope fixedly disposed on a top of the first connecting piece; wherein an end of the pulling rope facing away from the first connecting piece is fixedly connected to the bottom of the second connecting piece, the pulling rope is passed around the first pulley and the second pulley, a side wall of the pulling rope is fixedly connected to an inner side of the first pulley, the second pulley is configured to change a pulling direction of the pulling rope to the second connecting piece, so as to make the pulling rope pull one of the testing probes to move upwards through the first connecting piece and pull the other of the testing probes to move downwards through the second connecting piece when the servo motor drives the first pulley to rotate.

2. The testing apparatus as claimed in claim 1, wherein the testing machine further comprises box doors hinged to a front and a back of the box respectively; the box door disposed on the back of the box is defined with an installation hole configured to sleeve the servo motor, and the bottom of the box is defined with a through-hole configured to move the testing probes.

3. The testing apparatus as claimed in claim 1, wherein each auxiliary component further comprises a second sliding groove defined on the front of the first slider and extended to a bottom of the first slider; a second slider is fixedly disposed on a top of the connecting plate, the second slider is matched to the second sliding groove, and a top of the second slider defines a limit groove.

4. The testing apparatus intelligent electric meter digital manufacturing platform as claimed in claim 3, wherein each auxiliary component further comprises a U-shaped frame fixedly disposed on a top of the first slider; a limit rod is sleeved to a top of the U-shaped frame and is extended to an inner side of the U-shaped frame, and a lower end of the limit rod is matched to an inner wall of the limit groove; the limit groove is located directly below the limit rod when the second slider slides into the second sliding groove and is tightly pressed against the second sliding groove to stop sliding.

5. The testing apparatus as claimed in claim 4, wherein each auxiliary component further comprises a baffle plate fixedly sleeved to a side wall of the limit rod located in the U-shaped frame; a spring is sleeved between the side wall of the limit rod and a top of the baffle plate, and the spring is configured to elastically support the baffle plate and the limit rod.

6. The testing apparatus as claimed in claim 5, wherein a lower end of the first slider is designed to be a concave shape to make the second slider drive the connecting plate to move to the bottom of the first slider along the second sliding groove.

7. The testing apparatus as claimed in claim 1, wherein inclination degrees of the first connecting piece, the second connecting piece and the testing probes are consistent with inclination degrees of the first sliding grooves.

8. A testing apparatus for testing a smart electric meter, the testing apparatus comprising: a workbench, a conveyor disposed on a top of the workbench, a frame fixedly disposed on a back of the workbench, an electric push rod fixedly disposed on an inner side of the frame, and a testing machine disposed on a telescopic shaft of the electric push rod;

wherein the testing machine comprises: a box fixedly disposed on the telescopic shaft of the electric push rod, a testing component disposed in the box, and testing probes disposed on a bottom of the testing component;

wherein the testing component comprises an installation base fixedly disposed on an inner wall of a bottom of the box; first sliding grooves are defined on a front of the installation base and mirror-symmetrically arranged with a center point of the installation base, the first sliding grooves are designed to be inclined, and a first connecting piece and a second connecting piece are respectively slidably connected to insides of the first sliding grooves; bottoms of the first connecting piece and the second connecting piece are respectively fixedly connected to tops of the testing probes, auxiliary components are respectively disposed between the first sliding grooves and the first connecting piece and the second connecting piece, and the auxiliary components are configured to connect the first sliding grooves and the first connecting piece and the second connecting piece;

wherein each auxiliary component comprises a first slider disposed in a corresponding one of the first sliding grooves and configured to slide along the corresponding one of the first sliding grooves; a front of the first slider is slidably connected to a connecting plate, and a front of the connecting plate is fixedly connected to a back of a corresponding one of the first connecting piece and the second connecting piece; and wherein each auxiliary component further comprises a second sliding groove defined on the front of the first slider and extended to a bottom of the first slider; a second slider is fixedly disposed on a top of the connecting plate, the second slider is matched to the second sliding groove, and a top of the second slider defines a limit groove.

\* \* \* \* \*